US006947859B2

United States Patent
To et al.

(10) Patent No.: US 6,947,859 B2
(45) Date of Patent: Sep. 20, 2005

(54) DYNAMIC CURRENT CALIBRATED DRIVER CIRCUIT

(75) Inventors: Hing "Thomas" Y. To, Folsom, CA (US); John T. Maddux, Folsom, CA (US); Jonathan H. Liu, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 54 days.

(21) Appl. No.: 10/623,396

(22) Filed: Jul. 18, 2003

(65) Prior Publication Data

US 2004/0017220 A1 Jan. 29, 2004

Related U.S. Application Data

(63) Continuation of application No. 09/752,258, filed on Dec. 28, 2000, now Pat. No. 6,631,338.

(51) Int. Cl.[7] .............................................. H03K 19/003
(52) U.S. Cl. ...................................................... 702/67
(58) Field of Search ........................... 702/107, 18, 110, 702/45, 173; 365/190, 189, 154, 756, 45, 156; 327/533, 108, 74, 553, 538; 375/222; 326/30; 386/117, 94; 331/111; 363/98; 323/315, 282; 210/90; 347/45; 604/65; 73/19, 865, 866; 141/83, 18; 44/253

(56) References Cited

U.S. PATENT DOCUMENTS

| 4,764,925 A | 8/1988 | Grimes et al. |
| 4,995,001 A | 2/1991 | Dawson et al. |
| 5,245,254 A | 9/1993 | Lee |
| 5,254,883 A | 10/1993 | Horowitz et al. |
| 5,663,661 A | 9/1997 | Dillon et al. |
| 5,699,024 A | * 12/1997 | Manlove et al. ............ 331/111 |
| 5,914,633 A | * 6/1999 | Comino et al. ............ 327/553 |
| 6,009,487 A | 12/1999 | Davis et al. |
| 6,094,075 A | 7/2000 | Garrett, Jr. et al. |
| 6,181,969 B1 | 1/2001 | Gord |

* cited by examiner

Primary Examiner—Michael Nghiem
Assistant Examiner—Tung S. Lau
(74) Attorney, Agent, or Firm—Blakely Sokoloff Taylor and Zafman

(57) ABSTRACT

A method to calibrate I/O cell current has been described. The method includes setting a global control value provided to the I/O cells. Then, for each I/O cell, the method includes comparing the logic voltage at the output pad of the I/O cell with a reference voltage, and sinking more current at the output pad by enabling additional driver bits associated with the I/O cell if the logic voltage is higher than the reference voltage, or sinking less current at the output pad by disabling additional driver bits associated with the I/O cell if the logic voltage is lower than the reference voltage.

8 Claims, 4 Drawing Sheets

DYNAMIC CURRENT CALIBRATED DRIVER CIRCUIT

This Application is a Continuation of the prior application Ser. No. 09/752,258 for "DYNAMIC CURRENT CALIBRATED DRIVER CIRCUIT" filed by Hing Thomas Y. To, et al., on Dec. 28, 2000 now U.S. Pat. No. 6,631,338.

FIELD OF THE INVENTION

The present invention relates generally to the field of integrated circuits. More particularly, to methods and apparatus for driving full voltage swing digital signals across bus transmission lines.

BACKGROUND OF THE INVENTION

Integrated circuits such as microprocessors typically send and receive information via digital signals transmitted on high-speed terminated buses. This places importance on the implementation of output driver circuitry having the drive strength to sent logic signals across the terminated buses without degradation of voltage swing levels. For example, in past situations where the output pad of the integrated circuit is coupled to a high-speed bus that has multiple connections to other devices, output drivers with insufficient current driving capability have suffered from diminished voltage swing levels. Basically, the open drain driver transistors lack the capacity to sink sufficient current at the output pad, which results in a logical low voltage ($V_{OL}$) that deviates from the ideal, specified $V_{OL}$ level.

To alleviate this problem, various circuit designs have been proposed to provide current control for output drivers coupled to a high-speed bus. By way of example, U.S. Pat. Nos. 6,094,075; 6,009,487; 5,663,661; and 5,254,883 disclose techniques for controlling the transistor circuitry that controls bus current. What these techniques have in common is that they rely upon a current control value that is stored in a latch or register on the integrated circuit. The current control value is a calibrated digital value used to control the voltage swing level of the output drivers. The register or latch that stores the current control value is typically coupled to each of the output drivers of the chip.

The current control value is usually set in accordance with the particular application or type of bus to be driven (e.g., TTL, ECL, Rambus™, etc.). By way of example, the current control value that sets the voltage swing level for a Rambus™ open drain driver is typically determined by sampling two I/O bit cells. These two I/O slice voltage swings are compared to specific values and the control value is increased or decreased until the required voltage swing appears between these two I/O cells. The control logic then distributes the calibrated current control value among all the I/O cells on the integrated circuit.

However, there is a serious drawback of this approach. Sampling the voltage swings between only two bit cells and using this measurement to determine a single calibrated current control value for all the bit slices does not account for local abnormalities or process variations across the die. Transistor threshold voltage and other important transistor parameters often vary between each of the I/O bit slices. For instance, a normal Rambus application-specific cell (ASIC) has at least 26 I/O bit slices. This means that the transistor of the voltage comparator in the current control logic may not share the same transistor operating characteristics as the transistors in each of the I/O cells. Moreover, each Rambus ASIC cell is about 4000 microns wide, making variations across the die unavoidable.

Because of die process variations, the current control value distributed across the chip does not correctly calibrate every I/O driver cell. Indeed, many output drivers end up having voltage swing levels that are compromised due to local inaccuracies. Replicating the global current calibration logic and control logic in each of the I/O bit cells in order to calibrate each of the bits individually would, of course, be very costly in terms of silicon layout area and power consumption.

Therefore, what is needed is a new approach to the problem of current calibration to compensate for on-die process variations in output driver circuitry.

BRIEF DESCRIPTION OF THE DRAWINGS

The present invention will be understood more fully from the detailed description which follows and from the accompanying drawings, which however, should not be taken to limit the invention to the specific embodiments shown, but are for explanation and understanding only.

DETAILED DESCRIPTION

A dynamic current calibration circuit for an output driver is described. In the following description, numerous details are set forth, such as specific circuit configurations, device sizes, bit lengths, etc., in order to provide a thorough understanding of the invention. It will be clear, however, to one skilled in the art, that these specific details may not be needed to practice the present invention.

Figure 1:
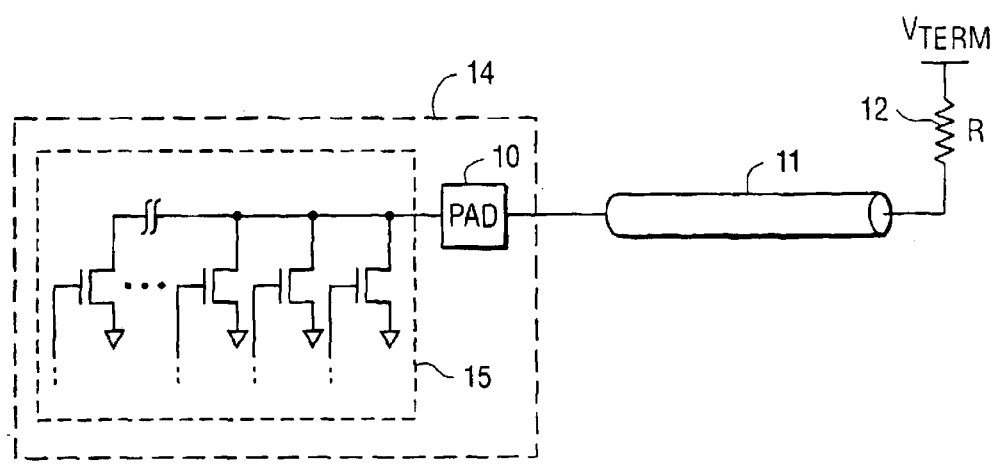
FIG. 1 is a diagram of a conventional circuit configuration for driving a high-speed bus.

FIG. 1 shows the conventional approach for driving a particular voltage swing on a high-speed I/O bus. The bus transmission line 11 is shown connected to an output pad 10 of integrated circuit 14 at one end. The other end is terminated to a positive supply voltage ($V_{TERM}$) through a resistor 12. The voltage swing at pad 10 is determined by an array of parallel-coupled n-channel field-effect transistors 15.

The gate voltages of the respective FETs set the voltage swing, or drive strength, at pad 10. That is, drive strength increases with the number of transistors that are made to conduct current, i.e., turned "on", by a high voltage appearing at the gate of each transistor. Drive strength may also be affected by the relative size relationship of each of the FETs in array 15. For example, it is not uncommon for array 15 to include FETs having sizes that vary as an integer power of two, e.g., 2×, 4×, 8×, etc., to provide greater range in drive capability.

As discussed previously, there is a need for some sort of calibration scheme to adjust the relative drive strength of the output drivers. Absent calibration of the I/O bits, the output voltage swing can be corrupted, thereby reducing logic level sensing capability. A widely adopted prior art technique has been to distribute a single current calibration value among all the I/O cells. This approach, however, cannot compensate for unavoidable process variations that occur across the die.

Figure 2:
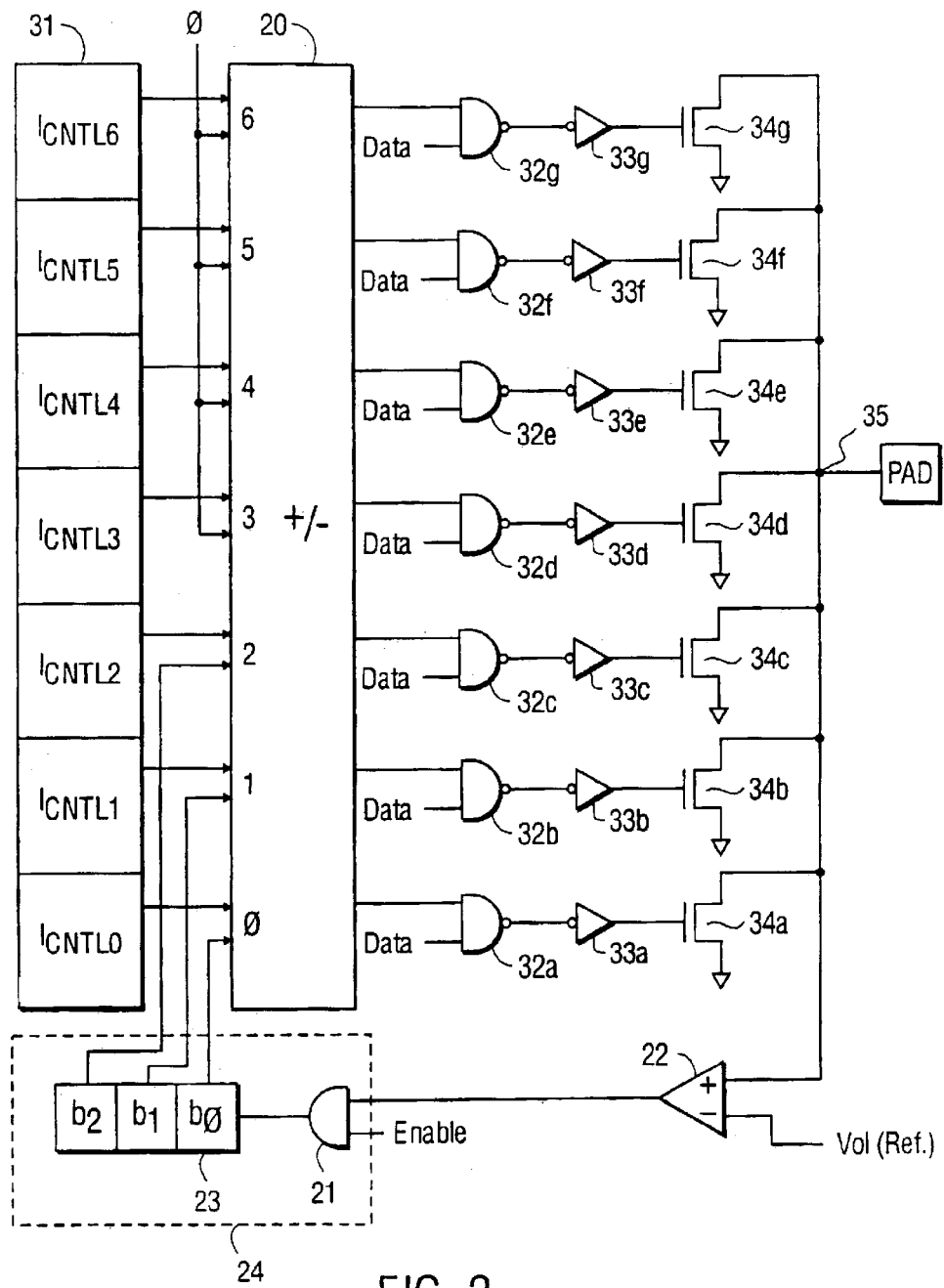
FIG. 2 is a circuit schematic diagram of a driver circuit in accordance with one embodiment of the present invention.

FIG. 2 is a detailed circuit schematic diagram of one embodiment of the dynamic current calibration scheme of the present invention. The circuit of FIG. 2 comprises a current control register 31, which contains a 7-bit global current control value ($I_{CNTL}$). This value represents a coarse determination of the driver strength for all the I/O bits. In accordance with the present invention, the current control value is distributed from register 31 to all of the output drivers on the chip.

The advancement of the present invention lies in its implementation of local logic circuitry to adjust or "fine tune" the global current calibrated value stored in register 31. This logic circuitry comprises add/subtract circuit 20, control block 24, and comparator 22 in the embodiment shown in FIG. 2. These elements operate to fine tune the lower bit field (i.e., the least significant bits) of the current control value to compensate for small deviations resulting from local differences in each of the I/O bits.

In the example of FIG. 2, the current control value is shown partitioned such that each of the lower 3 bits ($I_{CNTL0-2}$) are either added (or subtracted) with corresponding ones of the three local bits $b_2$–$b_0$ stored in register device 23 of control block 24. As shown, $I_{CNTL0}$ is added with local bit $b_0$, $I_{CNTL1}$ is added with local bit $b_1$, and $I_{CNTL2}$ is added with local bit $b_2$. These bits are provided as inputs to adder/subtract circuit 20, which, in turn, outputs an adjusted or calibrated 7-bit value that is provided as an input to NAND gates 32. Note that the most significant upper four control value bits are simply added to zero; that is, they are basically unaffected unless a carry or borrow is generated by the addition of the least significant bits. Accordingly, the lower 3-bits of adder/subtract circuit 20 may be implemented as a full adder, and the upper 4-bits implemented as a half-adder to handle a carry.

Register device 23 may be implemented as 3-bit counter that either counts up or down, depending on the output of comparator 22. For example, device 23 would count up if the logic voltage at the output pad were greater than the reference voltage (e.g., the correction value output by comparator 22 is positive). A higher local value would produce a higher calibrated value provided to the logic circuitry comprising NAND gates 32 and inverters 33. On the other hand, device 23 would count down if the logic voltage at the output pad were lower than the reference voltage to produce a lower calibrated value.

Another alternative is to implement device 23 as an ordinary shift register. In that case, 1s would be shifted into the register in order to increase the sink current at the output pad, and 0s would be loaded into the register for the purpose of decreasing the sink current. Of course, device 23 may be implemented using other standard circuits.

In operation, the present invention takes the current control value contained in register 23 and adjusts the lower bit portion to produce a calibrated value. Each of the seven bits of the calibrated value is provided as a separate input to a corresponding gate 32, which performs a logical NAND function with a input data value. The output of each of the NAND gates 32a–32g is inverted (by corresponding logic elements 33a–33g) before being provided to the gates of corresponding FETs 34a–34g.

Practitioners familiar with the field of integrated circuits will appreciate that the bit field partitioning of particular implementations may vary. In cases where the voltage swing adjustment is relatively small, using the lower three bits provides adequate fine tuning control over current calibration. In other embodiments, fewer or more bits for the local value may be used.

In a standard open drain configuration, each of the field-effect transistors 34 has its drain connected directly to output node, i.e., pad, 35.

In accordance with the present invention, node 35 is coupled to one input of a comparator 22. The other input of comparator 22 is coupled to receive a reference voltage, $V_{(REF)}$, which represents an ideal logical low output voltage $V_{OL}$ of the chip. The function of comparator 22 therefore is to detect the offset or deviation in the logical voltage appearing at node 35 from the ideal reference voltage level. The output of comparator 22 is a correction value that indicates whether an increase or a decrease in current calibration is required.

In the embodiment of FIG. 2, the correction value provided by comparator 22 is coupled through AND gate 21 to register device 23. The other input of AND gate 21 is coupled to receive an enable input signal. The logic in this embodiment is controlled by a fine-tune enable signal. Once this signal is raised to a logically high level, the correction value output from comparator 22 is provided to add/subtract circuit 20. Thus, the enable signal effectively allows the pad voltage of a particular I/O cell to be compared with the ideal voltage low level. Other signals, such as a clocking signal, may also be used to gate or control the operation of block 24.

As discussed previously, the correction value output by comparator 22 causes the 3-bit local value stored in register device 23 to be either incremented or decremented. For instance, if the correction value has a negative polarity, indicating that $V_{OL}$ at node 35 is below $V_{OL(REF)}$, add/subtract circuit 20 will subtract a binary one from the 3-bit value ($I_{CNTL-2}$) input from register 31. For example, if the correction value is positive, meaning $V_{OL}$ at node 35 is above $V_{(REF)}$, the 3-bit local value may be incremented by a binary one. Because the contents of register device 23 is added/subtracted with the least significant bit portion of the control value stored in register 31, the logic voltage at node 35 is eventually corrected by feedback. In other words, the dynamic calibration scheme of the present invention fine-tunes the lower bit field by offsetting the original current control value stored in register 31.

It should be understood that comparator 22 is normally incorporated in the I/O cell on the integrated circuit such that the driver and the comparator are located close to each other. In doing so, transistor parameter variation is minimized.

Since comparator 22 may typically be implemented as an analog device, its output can also be used to indicate the magnitude of the adjustment needed to correct the voltage swing at the output pad. By way of example, an alternative embodiment may include an analog-to-digital (A/D) converter coupled to the output of comparator 22. The A/D converter would function to digitize the correction value provided by comparator 22. This digitized signal may be input directly to register device 23.

It is further appreciated that the reference voltage, representing the ideal logical low voltage, may be generated locally from any one of a number of ordinary bias circuits.

To better understand and appreciate the present invention, consider the following example. Assume that register 31 contains the binary value 1111100, and that register 23 contains the local value 000, Further assume that these values results in a $V_{OL}$ at output pad 35 that is higher than the required $V_{OL}$. In this case, the three least significant bits output by add/subtract circuit 20 are the binary value 100. Since the $V_{OL}$ at output pad 35 is too high, comparator 22 produces a positive correction value indicative of the required offset. This correction value causes register device to increase its value, say, to the binary value 001 or 010. The calibrated value is therefore increased, resulting in increased current sinking capability at node 35 through transistors 34.

The increased current flow acts to lower $V_{OL}$, bringing it down to the required level. Depending on the particular implementation of control block 24, the process may continue iteratively until the logic voltage at the output pad is substantially equal to the reference voltage (e.g., less than one-half a LSB), or it may complete in one or more cycles.

Thus, the present invention provides local fine tune capability to each of the I/O drivers on an integrated circuit. This enables each I/O driver to be set to optimal drive strength, with each I/O cell performing its own local calibration concurrently. Moreover, fine-tuning by bit offset in accordance with the present invention can be achieved in a minimum number of adjustment cycles. This is because the methodology starts with a global current control value and only performs a minor adjustment on the lower bit field, as necessary.

Figure 3:
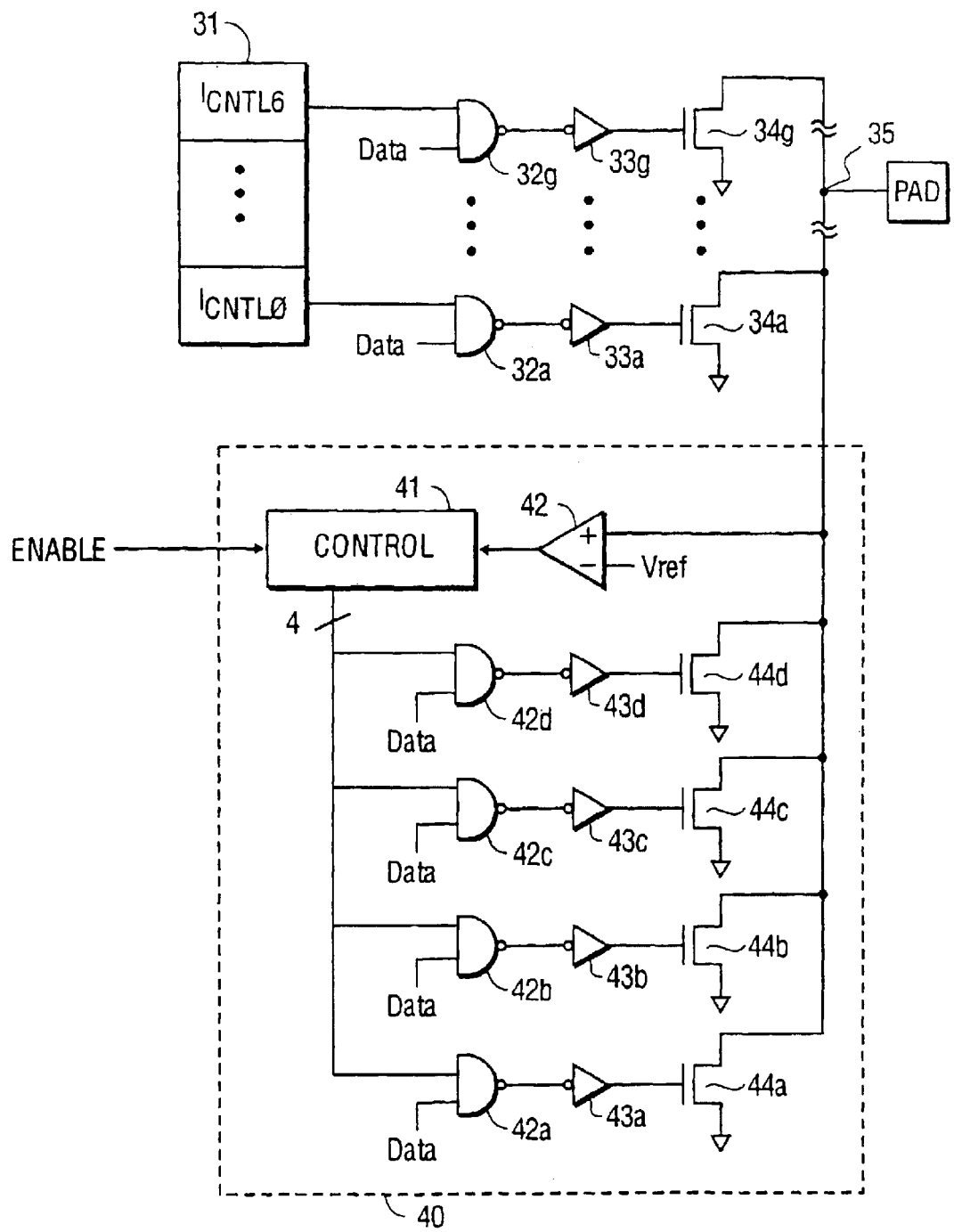
FIG. 3 is a circuit schematic diagram of a driver circuit in accordance with an alternative embodiment of the present invention.

FIG. 3 is an alternative embodiment of the present invention in which the upper circuitry, consisting of register 31, logic gates 32 & 33, and parallel-coupled FETs 34, represents the standard driver circuitry discussed earlier. Modification cell 40 comprises additional circuitry that may be incorporated into each I/O cell to dynamic current calibration to offset process variations across the chip. In this embodiment, comparator 42 drives control block 41, which, in turn, delivers a 4-bit output, with each bit being coupled to an input of a corresponding NAND logic gate 42. The other input of the NAND gates is coupled to the data input of the upper half of the diagram. The output of each of NAND gates 42 is coupled to a corresponding FET 44 through an inverter 43. For instance, NAND gate 42a is coupled to FET 44a through inverter 43a, and so on. The drain outputs of the additional FETs 44 are coupled to the output pad (i.e., node 35) and their sources are grounded.

Control block 41 of FIG. 3 may comprise the same logic elements as block 24 of FIG. 2; in this case, a 4-bit register device (e.g., a counter or shift register) and an AND gate to control operations with an external enable signal, clocking signals, etc. Thus, this alternative embodiment obviates the need for add/subtract circuit 20.

Figure 4:
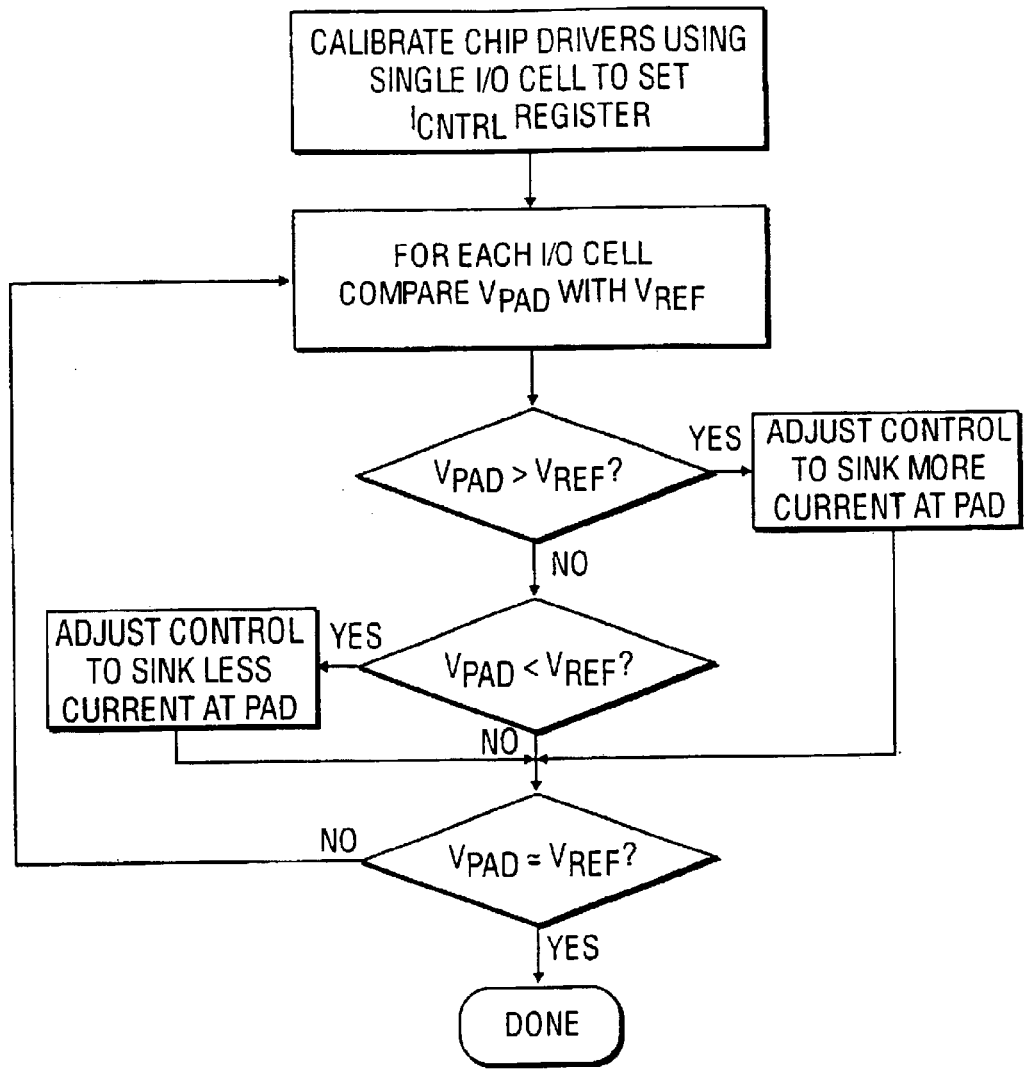
FIG. 4 is a flow chart diagram illustrating one embodiment of the method of the present invention.

In operation, the 4-bit local value is either increased or decreased to effectively enable or disable one or more of additional FETs 44. An example is described in conjunction with the flow diagram of FIG. 4. To begin, control block 41 may store a default 4-bit local value that result in FETs 44a & 44b being turned-on (i.e., conducting), and FETs 44c & 44d being turned-off (non-conducting). With this default setting applied to all of the I/O cells on the chip, the global current control value may be set according to the conventional practice of using a single I/O cell to set the value stored in register 31. This completes the coarse calibration process.

To dynamically fine-tune each of the driver cells, comparator 42 compares the logic voltage at an individual I/O cell against the reference voltage. If the pad voltage is higher than the reference voltage, this means that the sink current of the cell is insufficient. Control block 41 may respond by enabling one or both of the additional transistors 44c and 44d in order to sink more current at the output pad (node 35). On the other hand, if the pad voltage is lower than the reference voltage, control block 41 may respond by disabling one or both of the additional transistors 44a and 44b in order to sink less current at node 35. If performed iteratively, this process continues until the logic voltage at node 35 is substantially equal to the reference voltage.

It is worth repeating that the modification cell 40 is incorporated into every driver cell associated with every I/O pad on the integrated circuit, including the one used for global calibration. The control block functions to either turn on or turn off the additional transistors 44 depending on whether it is required to sink more or less current to achieve the desired logic voltage swing at the output pad. As discussed previously, control block 41 may be implemented as an ordinary counter, register, shift register, etc.

Thus, the present invention provides local fine tune capability to each of the I/O drivers on an integrated circuit. This enables each I/O driver to be set to optimal drive strength, with each I/O cell performing its own local calibration concurrently. Moreover, fine-tuning by bit offset in accordance with the present invention can be achieved in a minimum number of adjustment cycles. This is because the methodology starts with a global current control value and only performs a minor adjustment on the lower bit field, as necessary.

While the present invention has been described in accordance with a particular embodiment, it is appreciated that it is also useful in a variety of different applications. That is, the methodology of the present invention can apply to any open drain current sink driver design.

We claim:

1. A method for current calibration of a plurality of I/O cells of an integrated circuit (IC) comprising:
    setting a global control value;
    providing the global value to the plurality of I/O cells to cause each of the plurality of I/O calls to output a logic voltage at a corresponding output pad; and
    for each I/O cell:
    feeding back the logic voltage at the corresponding output pad to a comparator;
    comparing the logic voltage at the corresponding output pad with a reference voltage; and
    sinking current at the corresponding output pad based on result of the comparing, sinking current at the output pad including sinking current at the corresponding output pad until the logic voltage at the corresponding output pad and the reference voltage are substantially equal.

2. The method of claim 1, wherein sinking current at the corresponding output pad comprises:
    enabling additional driver bits to sink more current at the corresponding output pad if the logic voltage is higher than the reference voltage; and
    disabling additional driver bits to sink less current at the corresponding output pad if the logic voltage is lower than the reference voltage.

3. The method of claim 2, wherein sinking current at the corresponding output pad comprises modifying a local value stored in a register device associated with a corresponding I/O cell based on the comparing of the logic voltage and the reference voltage.

4. The method of claim 3, further comprising shifting at least one of "1" and "0 " into the register device to modify the local value.

5. A method for current calibration of a plurality of I/O cells of an intergrated circuit (IC) comprising:
    setting a global control value:
    providing the global value to the plurality of I/O cells to cause each of the plurality of I/O cells to output a logic voltage at a corresponding output pad; and
    for each I/O cell:
    feeding back the logic voltage at the corresponding output pad to a comparator;

comparing the logic voltage at the corresponding output pad with a reference voltage; and sinking current at the corresponding output pad based on result of the comparing, sinking current at the corresponding output pad including enabling additional driver bits to sink more current at the corresponding output and if the logic voltage is higher than the reference voltage, disabling additional driver bits to sink less current at the corresponding output pad if the logic voltage is lower than the reference voltage, and modifying a local value stored in a register device associated with a corresponding I/O cell based on the comparing of the logic voltage and the reference voltage, wherein the register device comprises a counter and the local value is modified by incrementing or decrementing the local value.

6. A method comprising:

setting a global control value provided to a plurality of I/O cells to cause each of the plurality of I/O cells to output a logic voltage on a corresponding output pad;

then, for each of the plurality of I/O cells:

feeding back the logic voltage at the corresponding output pad to a comparator, comparing the logic voltage with a reference voltage; and setting a local value in a register device associated with a corresponding I/O cell in response to the global control value and result of the comparing of the logic voltage and the reference voltage, setting a local value in a register device including sinking a current at the corresponding I/O cell until the logic voltage at the corresponding I/O cell and the reference voltage are substantially equal.

7. The method of claim 6, further comprising enabling additional driver bits to modify the local value in the register device associated with the corresponding I/O cell in response to the comparison of the logic voltage and the reference voltage to sink more current at the corresponding output pad.

8. The method of claim 6, further comprising disabling additional driver bits to modify the local value in the register device associated with the I/O cell in response to the comparison of the logic voltage and the reference voltage to sink less current at the corresponding output pad.

* * * * *

UNITED STATES PATENT AND TRADEMARK OFFICE
CERTIFICATE OF CORRECTION

PATENT NO.   : 6,947,859 B2
DATED        : September 20, 2005
INVENTOR(S)  : To et al.

It is certified that error appears in the above-identified patent and that said Letters Patent is hereby corrected as shown below:

Column 6,
Line 28, delete "calls" and insert -- cells --.

Column 7,
Line 7, delete "and" and insert -- pad --.

Signed and Sealed this

Twentieth Day of December, 2005

JON W. DUDAS
*Director of the United States Patent and Trademark Office*